United States Patent
Jung et al.

(10) Patent No.: US 10,109,772 B2
(45) Date of Patent: Oct. 23, 2018

(54) LIGHT EMITTING DEVICE PACKAGE AND LIGHTING APPARATUS INCLUDING THE SAME

(71) Applicant: LG INNOTEK CO., LTD., Seoul (KR)

(72) Inventors: Sung Ho Jung, Seoul (KR); Bum Jin Yim, Seoul (KR); Sang Youl Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/053,559

(22) Filed: Feb. 25, 2016

(65) Prior Publication Data

US 2016/0254414 A1 Sep. 1, 2016

(30) Foreign Application Priority Data

Feb. 26, 2015 (KR) .................... 10-2015-0026969

(51) Int. Cl.
| | |
|---|---|
| *H01L 33/46* | (2010.01) |
| *H01L 33/40* | (2010.01) |
| *H01L 33/44* | (2010.01) |
| *H01L 33/42* | (2010.01) |
| *H01L 33/62* | (2010.01) |
| *H01L 33/38* | (2010.01) |
| *H01L 33/48* | (2010.01) |

(52) U.S. Cl.
CPC .......... *H01L 33/465* (2013.01); *H01L 33/405* (2013.01); *H01L 33/42* (2013.01); *H01L 33/44* (2013.01); *H01L 33/62* (2013.01); *H01L 33/382* (2013.01); *H01L 33/486* (2013.01)

(58) Field of Classification Search
None
See application file for complete search history.

(56) References Cited

U.S. PATENT DOCUMENTS 9,142,744 B2 * 9/2015 Tomizawa ............ H01L 33/486
2012/0018764 A1 * 1/2012 Choi ...................... H01L 33/54
257/99

(Continued)

FOREIGN PATENT DOCUMENTS

JP 2013/201411 A 10/2013
JP 2014/096539 A 5/2014

(Continued)

*Primary Examiner* — Reema Patel
*Assistant Examiner* — Steven Christopher
(74) *Attorney, Agent, or Firm* — Birch, Stewart, Kolasch & Birch, LLP

(57) ABSTRACT

Disclosed are a light emitting device package and a lighting apparatus. The light emitting device package includes a substrate, a light emitting structure disposed under the substrate and including a first conductive type semiconductor layer, an active layer, and a second conductive type semiconductor layer, a first electrode connected to the first conductive type semiconductor layer exposed through at least one contact hole, a second electrode connected to the second conductive type semiconductor layer, a first insulating layer configured to extend from under the light emitting structure to a space between a side of the light emitting structure and the first electrode and configured to reflect light, and a reflective layer disposed under the first insulating layer.

15 Claims, 7 Drawing Sheets

(56) References Cited

U.S. PATENT DOCUMENTS

| | | | |
|---|---|---|---|
| 2012/0074441 A1* | 3/2012 | Seo | H01L 27/153 |
| | | | 257/91 |
| 2013/0015483 A1 | 1/2013 | Shimokawa et al. | |
| 2013/0228744 A1 | 9/2013 | Kazama | |
| 2013/0292719 A1* | 11/2013 | Lee | H01L 33/08 |
| | | | 257/93 |
| 2014/0160754 A1 | 6/2014 | Lee et al. | |
| 2015/0333230 A1* | 11/2015 | Moon | H01L 27/156 |
| | | | 257/88 |

FOREIGN PATENT DOCUMENTS

| | | |
|---|---|---|
| KR | 10-2013-0008478 A | 1/2013 |
| KR | 10-2013-0011575 A | 1/2013 |
| KR | 10-2013-0139630 A | 12/2013 |

* cited by examiner

US 10,109,772 B2

LIGHT EMITTING DEVICE PACKAGE AND LIGHTING APPARATUS INCLUDING THE SAME

CROSS-REFERENCE TO RELATED APPLICATIONS

This application claims priority under 35 U.S.C. § 119 to Korea Application No. 10-2015-0026969 filed in Korea on 26 Feb. 2015 which is hereby incorporated in its entirety by reference as if fully set forth herein.

TECHNICAL FIELD

The embodiment relates to a light emitting device package and a lighting apparatus including the same.

BACKGROUND

Alight emitting diode (LED) is a type of a semiconductor device which exchanges signals by converting electricity into infrared light or light or is used as a light source using characteristics of a compound semiconductor.

Group III-V nitride semiconductors have been spotlighted as core elements of light emitting devices such as an LED, a laser diode (LD), and the like by virtue of physical and chemical characteristics thereof.

Such an LED has excellent eco-friendly properties because the LED does not include environmentally hazardous materials such as mercury (Hg) used in general lighting apparatuses, e.g., light bulbs, fluorescent lamps, etc., and are replacing the general light sources by virtue of characteristics of a long lifetime, low power consumption, etc. Research for improving the reliability of general light emitting device packages including the LEDs has been conducted in various ways.

In the case of general light emitting device packages in a flip chip bonding type, although light has to be emitted in an upward direction of the light emitting device package, the light is emitted in a downward direction, and thus there is a problem that the efficiency of light output is degraded.

SUMMARY

The embodiment provides a light emitting device package having an improved efficiency of light output and a lighting apparatus including the same.

According to the embodiment, there is provided a light emitting device package including: a substrate; a light emitting structure disposed under the substrate and including a first conductive type semiconductor layer, an active layer, and a second conductive semiconductor layer; a first electrode connected to the first conductive semiconductor layer exposed through at least one contact hole; a second electrode connected to the second conductive type semiconductor layer; a first insulating layer configured to extend from under the light emitting structure to a space between a side of the light emitting structure and the first electrode and configured to reflect light; and a reflective layer disposed under the first insulating layer.

The reflective layer may be disposed to further extend to be under at least one of the first electrode or the second electrode. The reflective layer may be disposed under the at least one contact hole. For example, a width of the reflective layer in a direction perpendicular to a thickness direction of the light emitting structure may be greater than a width of the at least one contact hole. Also, when the at least one contact hole includes a plurality of contact holes, the width of the reflective layer in a direction perpendicular to a thickness direction of the light emitting structure may be greater than the sum of widths of the plurality of contact holes.

The light emitting device package may further include a first pad and a second pad respectively connected to the first electrode and the second electrode, and a second insulating layer disposed between the reflective layer and the second pad. The first pad may be connected to the reflective layer. At least two of the first electrode, the reflective layer, or the first pad may include the same material. That is, the first pad may be connected to the first electrode via the reflective layer.

The first electrode may be connected to the reflective layer. The first insulating layer may include a distributed Bragg reflector. The light emitting device package may further include a passivation layer disposed between the distributed Bragg reflector and the side of the light emitting structure and between the distributed Bragg reflector and an upper portion of the light emitting structure.

The first insulating layer may include a first portion disposed under the light emitting structure and having a first thickness, and a second portion disposed between the first electrode and the side of the light emitting structure and having a second thickness different from the first thickness in the at least one contact hole.

The second thickness may be smaller than the first thickness. A thickness of the reflective layer may be in a range of 100 nm to 500 nm, and a thickness of the second electrode may be in a range of 100 nm to 1000 nm.

An end portion of the reflective layer may overlap the second electrode in a thickness direction of the light emitting structure. A minimum value of a width of the reflective layer overlapping the second electrode may be 2 µm. An end portion of the reflective layer may overlap the light emitting structure in a thickness direction of the light emitting structure.

The light emitting device package may further include a light transmissible electrode layer disposed between the second electrode and the second conductive type semiconductor layer. The light emitting device package may further include a first soldering portion and a second soldering portion respectively connected to the first pad and the second pad and electrically separated from each other, and a first lead frame and a second lead frame respectively connected to the first soldering portion and the second soldering portion and electrically separated from each other. The light emitting device package may further include a package body which forms a cavity with the first and second lead frames, wherein the substrate, the light emitting structure, the first electrode, the second electrode, the first insulating layer and the reflective layer may be disposed in the cavity.

According to the embodiment, there is provided a lighting apparatus including the light emitting device package.

BRIEF DESCRIPTION OF THE DRAWINGS

Arrangements and embodiments may be described in detail with reference to the following drawings in which like reference numerals refer to like elements and wherein.

DETAILED DESCRIPTION OF THE EMBODIMENTS

Figure 1:
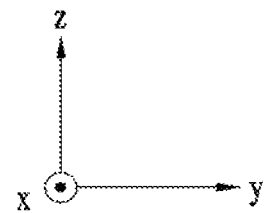
FIG. 1 is a plan view of a light emitting device package.
Figure 1:
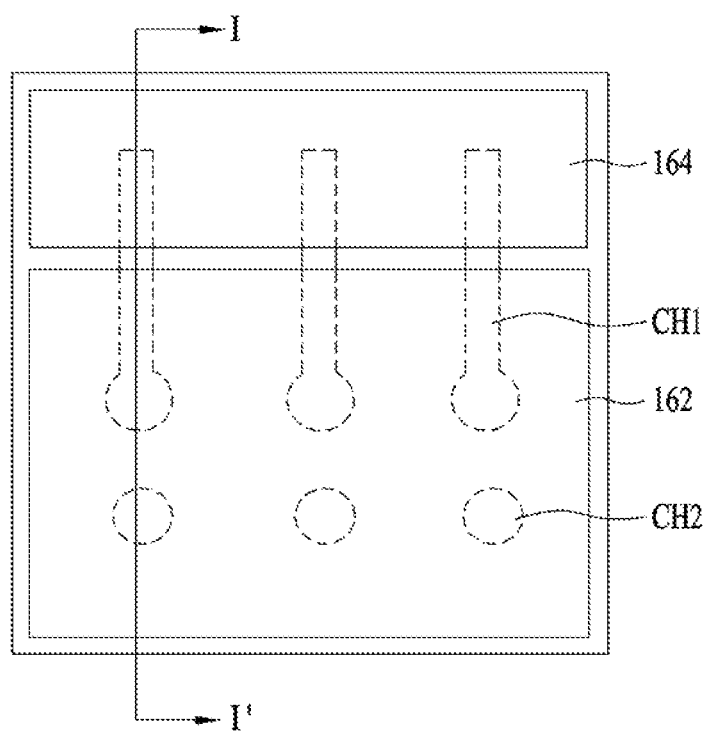

Hereinafter, embodiments of this disclosure will be described in detail with reference to the accompanying drawings to help understanding this disclosure. However, the embodiments according to this disclosure may have different forms and should not be construed as being limited to the descriptions set forth herein. The embodiments of this disclosure are provided so that this disclosure is thorough and complete and fully conveys the concept of this disclosure to those of ordinary skill in the art.

In the description of embodiments, it should be understood that when an element is referred to as being "on or under" another element, the term "on or under" refers to either a direct connection between two elements or an indirect connection between two elements having one or more elements formed therebetween. In addition, when the term "on or under" is used, it may refer to a downward direction as well as an upward direction with respect to an element.

Further, the relational terms such as "first" and "second," "over/upper portion/above," and "below/lower portion/under" do not necessarily require or include any physical or logical relationship or sequence between devices or elements, and may also be used only to distinguish one device or element from another device or element.

Thicknesses of layers and areas in the drawings may be exaggerated, omitted, or schematically described for a convenient and precise description. In addition, the size of each component does not fully match the actual size thereof.

Hereinafter, light emitting device package 100 according to embodiments will be described with reference to the accompanying drawings. For the sake of convenience, the light emitting device package 100 will be described using a Cartesian coordinate system (x-axis, y-axis, z-axis). However, other different coordinate systems may be used. In the Cartesian coordinate system, the x-axis, the y-axis, and the z-axis are perpendicular to one another. However, the disclosure is not limited thereto. That is, the x-axis, they-axis, and the z-axis may intersect one another instead of being perpendicular to one another.

Figure 2:
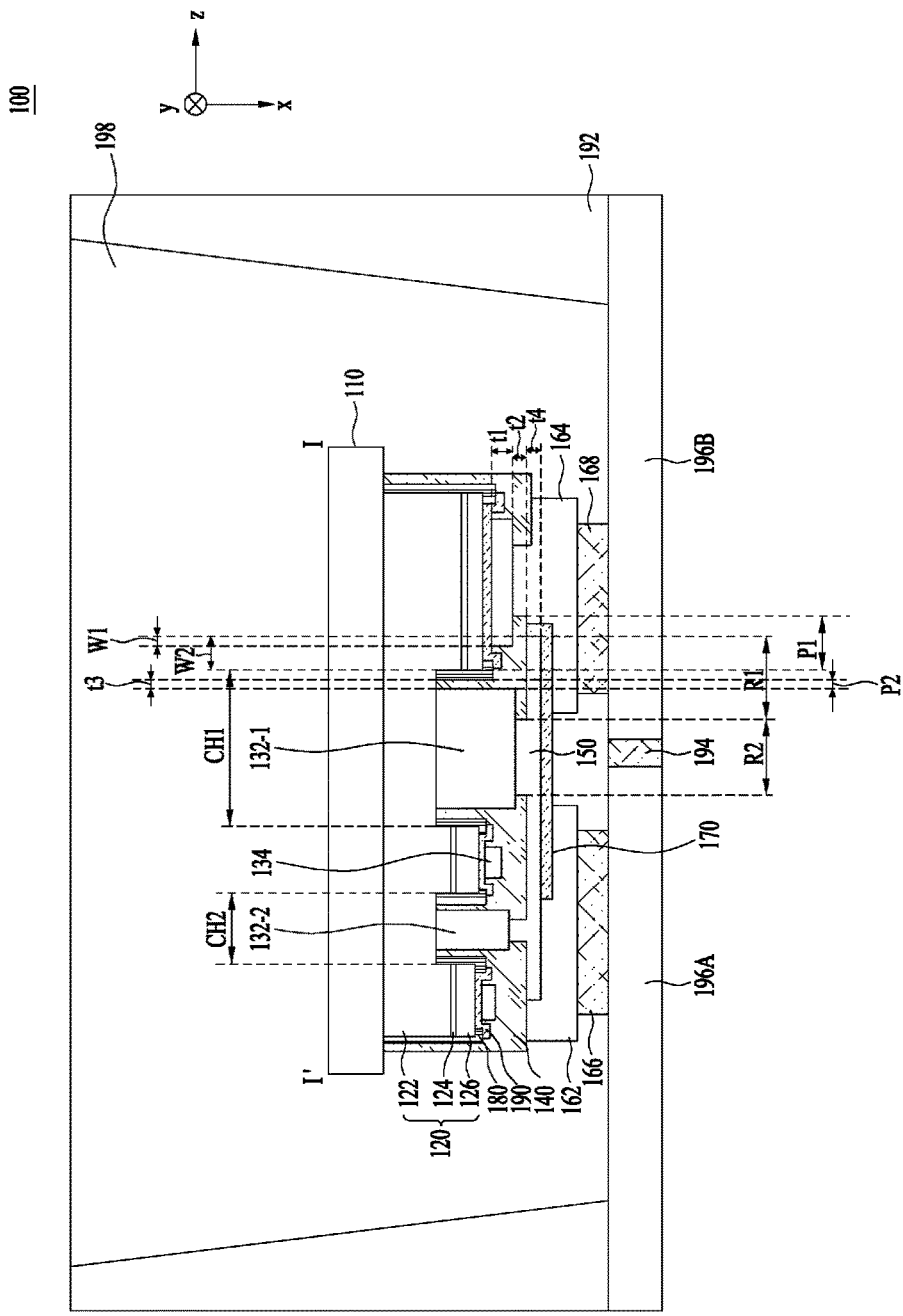
FIG. 2 is a cross-sectional view taken along line I-I' of the light emitting device package shown in FIG. 1.

FIG. 1 is a plan view of a light emitting device package 100, and FIG. 2 is a cross-sectional view taken along line I-I' of the light emitting device package 100 shown in FIG. 1.

Referring to FIGS. 1 and 2, the light emitting device package 100 according to the embodiment may include a substrate 110, a light emitting structure 120, first electrodes 132-1 and 132-2, a second, a first insulating layer 140, a reflective layer 150, a first pad 162, a second pad 164, a first soldering portion 166, a second soldering portion 168, a second insulating layer 170, a passivation layer 180, a light transmissible electrode layer 190, a package body 192, an insulator 194, a first lead frame 196A, a second lead frame 196B, and a molding member 198.

FIG. 1 is a plan view corresponding to a view when the cross-sectional view shown in FIG. 2 is seen in a +x-axis direction. For convenience of description, FIG. 1 only illustrates the first and second pads 162 and 164 and first and second contact holes CH1 and CH2 shown in FIG. 2.

The substrate 110 may include a conductive material or non-conductive material. For example, the substrate 110 may include at least one of sapphire $Al_2O_3$, GaN, SiC, ZnO, GaP, InP, $Ga_2O_3$, GaAs, or Si, but the embodiment is not limited to those materials for the substrate 110.

To improve a difference between coefficients of thermal expansion (CTE) of the substrate 110 and the light emitting structure 120 and lattice mismatch between the substrate 110 and the light emitting structure 120, a buffer layer or a transition layer (not shown) may be further disposed between the substrate 110 and the light emitting structure 120. The buffer layer may include, for example, at least one material selected from the group consisting of Al, In, N, and Ga, but is not limited thereto. Further, the buffer layer may have a single layer or multilayer structure.

The light emitting structure 120 may be disposed under the substrate 110. The light emitting structure 120 may include a first conductive type semiconductor layer 122, an active layer 124, and a second conductive type semiconductor layer 126 which are sequentially stacked in a downward direction (for example, a +x-axis direction) from the substrate 110.

The first conductive type semiconductor layer 122 is disposed under the substrate 110. The first conductive semiconductor type layer 122 may be implemented with a compound semiconductor containing Group III-V elements, Group II-VI elements or the like and may be doped with a first conductive type dopant. When the first conductive type semiconductor layer 122 is an n-type semiconductor layer, the first conductive type dopant is an n-type dopant and may include Si, Ge, Sn, Se, or Te, but is not limited thereto.

For example, the first conductive type semiconductor layer 122 may include a semiconductor material having a compositional formula of $Al_xIn_yGa_{(1-x-y)}N$ ($0 \leq x \leq 1$, $0 \leq y \leq 1$, $0 \leq x+y \leq 1$). The first conductive type semiconductor layer 122 may include at least one of GaN, InN, AlN, InGaN, AlGaN, InAlGaN, AlInN, AlGaAs, InGaAs, AlInGaAs, GaP, AlGaP, InGaP, AlInGaP, or InP.

The active layer 124 may be disposed between the first conductive type semiconductor layer 122 and the second conductive type semiconductor layer 126. The active layer 124 is a layer in which electrons (or holes) injected through the first conductive type semiconductor layer 122 meet holes (or electrons) injected through the second conductive type semiconductor layer 126 to emit light having an energy determined by an inherent energy band of a material forming the active layer 124. The active layer 124 may be formed with at least one of a single well structure, a multiple well structure, a single quantum well structure, a multi quantum well (MQW) structure, a quantum-wire structure, or a quantum-dot structure.

A well layer/barrier layer of the active layer 124 may be formed with one or more pair structures such as an InGaN/GaN structure, an InGaN/InGaN structure, a GaN/AlGaN structure, an InAlGaN/GaN structure, a GaAs (InGaAs)/AlGaAs structure, and a GaP(InGaP)/AlGaP structure, but is not limited thereto. The well layer may be formed of a material having a bandgap energy lower than a bandgap energy of the barrier layer.

A conductive type clad layer (not shown) may be formed above and/or under the active layer 124. The conductive type clad layer may be formed of a semiconductor having a bandgap energy higher than the bandgap energy of the barrier layer of the active layer 124. For example, the conductive type clad layer may include a GaN structure, an AlGaN structure, an InAlGaN structure, a superlattice structure, etc. Further, the conductive type clad layer may be doped to be n-type or p-type.

According to the embodiment, the active layer 124 may emit light in a wavelength band of ultraviolet rays. Here, the wavelength band of ultraviolet rays refers to a wavelength band in a range of 100 nm to 400 nm. Particularly, the active layer 124 may emit light in a wavelength band of 100 nm to 280 nm. However, the embodiment is not limited to the wavelength band of light emitted from the active layer 124.

The second conductive type semiconductor layer 126 may be disposed under the active layer 124. The second conductive type semiconductor layer 126 may be formed of a compound semiconductor, and may be implemented with a compound semiconductor such as a Group III-V semiconductor, Group II-VI semiconductor or the like. For example, the second conductive type semiconductor layer 126 may include a semiconductor material having a compositional formula of $In_xAl_yGa_{(1-x-y)}N$ ($0 \leq x \leq 1$, $0 \leq y \leq 1$, $0 \leq x+y \leq 1$). The second conductive type semiconductor layer 126 may be doped with a second conductive type dopant. When the second conductive type semiconductor layer 126 is a p-type semiconductor layer, the second conductive type dopant is a p-type dopant, and may include Mg, Zn, Ca, Sr, Ba, etc.

The first conductive type semiconductor layer 122 may be an n-type semiconductor layer, and the second conductive type semiconductor layer 126 may be implemented as a p-type semiconductor layer. Alternatively, the first conductive type semiconductor layer 122 may be a p-type semiconductor layer, and the second conductive type semiconductor layer 126 may be implemented as an n-type semiconductor layer.

The light emitting structure 120 may be implemented as any one structure of an n-p junction structure, a p-n junction structure, an n-p-n junction structure, and a p-n-p junction structure.

The first electrodes 132-1 and 132-2 may be electrically connected to the first conductive type semiconductor layer 122. As described later with reference to FIG. 3B, apart of the second conductive type semiconductor layer 126, a part of the active layer 124, and a part of the first conductive type semiconductor layer 122 are mesa-etched to form at least one contact hole, the first conductive type semiconductor layer 122 exposed at the at least one contact hole CH may be electrically connected to the first electrodes 132-1 and 132-2.

For example, referring to FIG. 1, the first electrodes may include a first-first electrode 132-1 and a first-second electrode 132-2. The first-first electrode 132-1 in a finger shape may be disposed at the first contact hole CH1, and the first-second electrode 132-2 may be disposed at the second contact hole CH2. The first electrodes 132-1 and 132-2 include an ohmic-contact material to serve an ohmic function, and thus an additional ohmic layer (not shown) may not need to be disposed, or the additional ohmic layer may be disposed on or under the first electrodes 132-1 and 132-2. For a better understanding, in FIG. 1, the first and second contact holes CH1 and CH2 covered by the first and second pads 162 and 164 are illustrated with dotted lines.

The second electrode 134 may be electrically connected to the second conductive type semiconductor layer 126. The second electrode 134 may have an ohmic characteristic and may include a material which ohmic-contacts the second conductive type semiconductor layer 126. When the second electrode 134 performs an ohmic function, an additional ohmic layer (not shown) may omitted.

Since the light emitting device package 100 shown in FIGS. 1 and 2 has a flip chip bonding structure, light emitted from the active layer 124 may be emitted through the first electrodes 132-1 and 132-2, the first conductive type semiconductor layer 122, and the substrate 110. To this end, the first electrodes 132-1 and 132-2, the first conductive type semiconductor layer 122, and the substrate 110 may be formed of a material having light transparency. At this point, the second conductive type semiconductor layer 126 and the second electrode 134 may be formed of a material having light transparency or light opacity or a material having reflectivity, but the embodiment is not limited thereto.

Each of the first and second electrodes 132-1, 132-2, and 134 may be formed using any material which reflects or transmits light emitted from the active layer 124 instead of absorbing the light, and may be grown at a high quality on the first and second conductive type semiconductor layers 122 and 126. For example, each of the first and second electrodes 132-1, 132-2, and 134 may be formed of a metal, and may be formed of Ag, Ni, Al, Rh, Pd, Ir, Ru, Mg, Zn, Pt, Au, Hf, and a selective combination thereof.

When the second electrode 134 is implemented as silver (Ag) and a first thickness t1 of the second electrode 134 is smaller than 100 nm, silver agglomerates and voids may be generated in the second electrode 134. Thus, as will be described later, when there is the light transmissible electrode layer 190, an operating voltage may have a minor influence but the reflectance of the second electrode 134 may be degraded. In addition, when the first thickness t1 is greater than 1000 nm, atoms of silver migrate and then a short may occur. Although there is a dielectric layer which blocks the migration of silver atoms, the migration of atoms may be generated and delamination of the light transmissible electrode layer 190 may occur. Accordingly, the first thickness t1 may be in a range of 100 nm to 1000 nm, but the embodiment is not limited thereto.

Meanwhile, the light transmissible electrode layer 190 may be disposed between the second electrode 134 and the second conductive type semiconductor layer 126. The light transmissible electrode layer 190 may be a transparent conductive oxide (TCO). For example, the light transmissible electrode layer 190 may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, or Ni/IrOx/Au/ITO, but is not limited to the above materials.

In some cases, the light transmissible electrode layer 190 may be omitted.

Meanwhile, the first insulating layer 140 may extend from under the light emitting structure 120 to a space between sides of the light emitting structure 120 and the first electrodes 132-1 and 132-2.

The first insulating layer 140 may include a first portion P1 and a second portion P2. The first portion P1 is a portion disposed under the light emitting structure 120 and has a second thickness t2. The second portion P2 is disposed between the first electrodes 132-1 and 132-2 and the sides of the light emitting structure 120, and has a third thickness t3. Here, the second thickness t2 and the third thickness t3 may be different from each other. As will be described later, when the first insulating layer 140 is formed by a physical vapor deposition (PVD) method, the third thickness t3 may be smaller than the second thickness t2.

According to the embodiment, the first insulating layer 140 may be implemented as a material which performs both insulating and reflective functions. For example, the first insulating layer 140 may include a distributed Bragg reflector (DBR), but the embodiment is not limited thereto. The DBR has a thickness of mλ/4n and a structure in which a low refractive index layer and a high refractive index layer are stacked alternately. λ refers to a wavelength of light emitted from the active layer 124, n refers to a refractive index of a medium, and m is an odd number. The low refractive index layer may include, for example, silicon oxide ($SiO_2$) having a refractive index of 1.4 or aluminum oxide ($Al_2O_3$) having a refractive index of 1.6, and the high refractive index layer may include, for example, silicon nitride ($Si_3N_4$) having a refractive index of 2.05 to 2.25, titanium nitride ($TiO_2$) having a refractive index of 2 or more, or Si—H having a refractive index of 3 or more, but the embodiment is not limited thereto. The number of the low refractive index layers and the high refractive index layers may be changed variously.

Since the first insulating layer 140 has an insulating function, the first electrodes 132-1 and 132-2 may be electrically separated from the active layer 124 of the light emitting structure 120, and the first electrodes 132-1 and 132-2 may be electrically separated from the second conductive type semiconductor layer 126 of the light emitting structure 120. Further, since the first insulating layer 140 has a reflective function, light emitted from the active layer 124 and directing the first and second lead frames 196A and 196B rather than toward the substrate 110 may be reflected.

Further, the passivation layer 180 may also be disposed between the first insulating layer 140, i.e., the DBR, and the sides of the light emitting structure 120, and may also be disposed between the first insulating layer 140, i.e., the DBR, and an upper portion of the light emitting structure 120. As described above, the passivation layer 180 may surround corners of the light emitting structure 120 and may be disposed on the upper portion and the sides of the light emitting structure 120. The passivation layer 180 may include at least one of $SiO_2$, $TiO_2$, $ZrO_2$, $Si_3N_4$, $Al_2O_3$, or $MgF_2$, but the embodiment is not limited to those materials for the passivation layer 180. In some cases, the passivation layer 180 may be omitted.

Meanwhile, the reflective layer 150 may be disposed under the first insulating layer 140. Referring to FIG. 2, the reflective layer 150 may include a first portion R1 disposed under the first insulating layer 140.

Further, the reflective layer 150 may be disposed under at least one of the first electrodes 132-1 and 132-2 or the second electrode 134. For example, as shown in FIG. 2, the reflective layer 150 may further include a second portion R2 disposed under the first electrodes 132-1 and 132-2.

Further, the reflective layer 150 may be disposed under at least one contact hole. For example, as shown in FIG. 2, the reflective layer 150 may be disposed under the first and second contact holes CH1 and CH2. In this case, a width of the reflective layer 150 in a direction intersecting a thickness direction (e.g., an x-axis direction) of the light emitting structure 120, e.g., a direction (e.g., a z-axis direction) perpendicular to the x-axis direction may be greater than the sum of widths of the first and second contact holes CH1 and CH2.

Further, an end portion of the first portion R1 of the reflective layer 150 may be disposed under the second electrode 134. That is, an end portion of the reflective layer 150 may overlap the second electrode 134 in the thickness direction (e.g., the x-axis direction) of the light emitting structure 120. Further, the end portion of the first portion R1 of the reflective layer 150 may overlap the light emitting structure 120 in the thickness direction (e.g., the x-axis direction).

When a first width W1 of the reflective layer 150 overlapping the second electrode 134 or a second width W2 of the reflective layer 150 overlapping the light emitting structure 120 is smaller than 2 μm, light emitted from the active layer 124 and directing the thickness direction (e.g., the x-axis direction) may not be reflected from the reflective layer 150 or the second electrode 134, and may be leaked through between the reflective layer 150 and the second electrode 134. Accordingly, a minimum value of the first width W1 and the second width W2 may be 2 μm, but the embodiment is not limited thereto.

The reflective layer 150 may be formed of a reflective material such as silver (Ag). When the reflective layer 150 is implemented as silver (Ag), and a fourth thickness t4 of the reflective layer 150 is smaller than 100 nm, silver agglomerates and voids may be generated in the reflective layer 150. Further, when the fourth thickness t4 is greater than 500 nm, atoms of silver migrate and then a short may occur. Although there is a dielectric layer which blocks the migration of silver atoms, the migration of silver atoms may occur. Accordingly, according to the embodiment, the fourth thickness t4 of the first portion R1 of the reflective layer 150 may be in a range of 100 nm to 500 nm, but the embodiment is not limited thereto.

As described above, when the third thickness t3 is smaller than the second thickness t2, the second portion P2 of the first insulating layer 140 may not completely perform a reflective function. In this case, light may be leaked through the second portion P2. To prevent this, according to the embodiment, the reflective layer 150 is disposed under the first insulating layer 140. Accordingly, due to the small thickness of the second portion P2 of the first insulating layer 140, light not reflected from the first insulating layer 140 and directing downward may be reflected by the reflective layer 150.

As described above, as long as leakage light not reflected from the first insulating layer 140 is reflected, an arrangement of the reflective layer 150 is not limited to the above described example.

Further, as shown in FIG. 2, the first electrodes 132-1 and 132-2 may be connected to the reflective layer 150, but the embodiment is not limited thereto.

Meanwhile, the first pad 162 may be electrically connected to the reflective layer 150, and the reflective layer 150 may be electrically connected to the first electrodes 132-1 and 132-2. Accordingly, the first pad 162 may be electrically connected to the first electrodes 132-1 and 132-2 via the reflective layer 150.

Further, when the reflective layer 150 is connected to the first pad 162, an actual area of the first pad 162 increases, thermal conductivity increases, and thus the efficiency of heat dissipation may be improved.

Further, the second pad 164 may be electrically connected to the second electrode 134.

Each of the first and second pads 162 and 164 may include a metal material having an electrical conductivity, and may include a material the same as or different from that of each of the first and second electrodes 132-1, 132-2, and 134.

At this point, according to the embodiment, at least two of the first electrodes 132-1 and 132-2, the reflective layer 150, or the first pad 162 may include the same material. For example, all of the first electrodes 132-1 and 132-2, the reflective layer 150, and the first pad 162 may be implemented as the same material. Alternatively, all of the first electrodes 132-1 and 132-2 and the reflective layer 150 may be implemented as the same material, and the first pad 162 may be implemented as a material different from that of the first electrodes 132-1 and 132-2. Alternatively, all of the first electrodes 132-1 and 132-2 and the first pad 162 may be implemented as the same material, and the reflective layer 150 may be implemented as a material different from that of the first electrodes 132-1 and 132-2. Alternatively, all of the reflective layer 150 and the first pad 162 may be implemented as the same material, and the first electrodes 132-1 and 132-2 may be implemented as a material different from that of the first pad 162.

Further, the second insulating layer 170 may be disposed between the reflective layer 150 and the second pad 164, and may electrically insulate the reflective layer 150 from the second pad 164. When the second insulating layer 170 is not disposed, the reflective layer 150 is electrically connected to the second pad 164, and thus the light emitting device package 100 may not operate. As described above, the second insulating layer 170 may serve to prevent an electrical short between the reflective layer 150 and the second pad 164.

The second insulating layer 170 may be implemented as the same material as the first insulating layer 140 or may be implemented as a material different from the first insulating layer 140. The second insulating layer 170 may include at least one of $SiO_2$, $TiO_2$, $ZrO_2$, $Si_3N_4$, $Al_2O_3$, or $MgF_2$, but the embodiment is not limited to those materials for the second insulating layer 170.

Meanwhile, the first soldering portion 166 may be disposed between the first pad 162 and the first lead frame 196A, and may electrically connect the first pad 162 to the first lead frame 196A. Further, the second soldering portion 168 may be disposed between the second pad 164 and the second lead frame 196B, and may electrically connect the second pad 164 to the second lead frame 196B.

Each of the first and second soldering portions 166 and 168 may be solder paste or solder balls.

The above-described first and second soldering portion 166 and 168 may electrically connect the first and second conductive type semiconductor layers 122 and 126 to the respective first and second lead frames 196A and 196B by the first and second pads 162 and 164, and thus the need for wires may be eliminated. However, according to another embodiment, the first and second conductive type semiconductor layers 122 and 126 may be respectively connected to the first and second lead frames 196A and 196B using wires.

Further, the first soldering portion 166 and the second soldering portion 168 may be omitted. In this case, the first pad 162 may perform a function of the first soldering portion 166, and the second pad 164 may perform a function of the second soldering portion 168. When the first soldering portion 166 and the second soldering portion 168 are omitted, the first pad 162 may be directly connected to the first lead frame 196A, and the second pad 164 may be directly connected to the second lead frame 196B.

Further, the first and second lead frames 196A and 196B may be respectively and electrically connected to the first and second soldering portions 166 and 168. The first and second lead frames 196A and 196B may be separated from each other in a direction intersecting the thickness direction (i.e., the x-axis direction) of the light emitting structure 120, e.g., a direction (i.e., a z-axis direction) perpendicular to the thickness direction. Each of the first and second lead frames 196A and 196B may be formed of a conductive material, e.g., a metal, but the embodiment is not limited to those materials for each of the first and second lead frames 196A and 196B. To electrically separate the first and second lead frames 196A and 196B, the insulator 194 may also be disposed between the first and second lead frames 196A and 196B. The insulator 194 may include at least one of $SiO_2$, $TiO_2$, $ZrO_2$, $Si_3N_4$, $Al_2O_3$, or $MgF_2$, but the embodiment is not limited to those materials for the insulator 194.

Further, when the package body 192 is formed of a conductive material, for example, a metal material, the first and second lead frames 196A and 196B may also be a part of the package body 192. In this case, the first and second lead frames 196A and 196B which form a part of the package body 192 are electrically separated from each other by the insulator 194.

Further, the package body 192 may form a cavity C. For example, as shown in FIG. 2, the package body 192 may form the cavity C with the first and second lead frames 196A and 196B. That is, the cavity C may be defined by an inner side surface of the package body 192 and upper surfaces of the first and second lead frames 196A and 196B. However, the embodiment is not limited thereto. According to another embodiment, unlike that shown in FIG. 2, the cavity C may be formed by the package body 192 only. Alternatively, a barrier wall (not shown) is disposed on a planar upper surface of the package body 192, and the cavity may be defined by the barrier wall and the upper surface of the package body 192. The package body 192 may be implemented as an epoxy molding compound (EMC), etc., but the embodiment is not limited to that material for the package body 192.

The substrate 110, the light emitting structure 120, the first electrodes 132-1 and 132-2, the second electrode 134, the first insulating layer 140, the reflective layer 150, the first pad 162, the second pad 164, the first soldering portion 166, the second soldering portion 168, the second insulating layer 170, the passivation layer 180, the light transmissible electrode layer 190, and the molding member 198 may be disposed in the cavity C.

Further, the molding member 198 may surround and protect the substrate 110, the light emitting structure 120, the first electrodes 132-1 and 132-2, the second electrode 134, the first insulating layer 140, the reflective layer 150, the first pad 162, the second pad 164, the first soldering portion 166, the second soldering portion 168, the second insulating layer 170, the passivation layer 180, and the light transmissible electrode layer 190 in the cavity C. The molding member 198 may be implemented as, for example, silicone (Si), and since a phosphor (or, fluorescent substance) is included, the molding member 198 may change a wavelength of light to be emitted from the light emitting device package. The phosphor may include any one of a YAG-based, a TAG-based, a silicate-based, a sulfide-based, and a nitride-based phosphors which may convert light generated from the light emitting device package into white light, but the embodiment is not limited to those types of phosphor.

One selected from $(Y, Tb, Lu, Sc, La, Gd, Sm)3(Al, Ga, In, Si, Fe)5(O, S)12:Ce$ may be used as the YAG-based and TAG-based phosphors, and one selected from $(Sr, Ba, Ca, Mg) 2SiO4: (Eu, F, Cl)$ may be used as the silicate-based phosphor.

Further, one selected from $(Ca, Sr) S:Eu$ and $(Sr, Ca, Ba)(Al, Ga)2S4:Eu$ may be used as the sulfide-based phosphor. At least one selected from phosphor components of $(Sr, Ca, Si, Al, O)N:Eu$ (e.g., $CaAlSiN4:Eu$ or $\beta\text{-SiAlON:Eu}$) and $(Ca_x, M_y) (Si, Al)12(O, N) 16$ of a Ca-$\alpha$SiAlON:Eu-based phosphor (here, M is at least one material of Eu, Tb, Yb, or Er, and $0.05<(x+y)<0.3$, $0.02<x<0.27$ and $0.03<y<0.3$) may be used as the nitride-based phosphor.

As a red phosphor, the nitride-based phosphor including N (e.g., CaAlSiN3:Eu) may be used. Such the nitride-based red phosphor has a low risk of color change as well as excellent reliability with respect to external conditions including heat, moisture, and the like when compared to the sulfide-based phosphor.

Hereinafter, a method of manufacturing the light emitting device package 100 shown in FIGS. 1 and 2 will be described with reference to the accompanying drawings below, but the embodiment is not limited thereto. That is, the light emitting device package 100 shown in FIGS. 1 and 2 may obviously be manufactured by a different manufacturing method.

FIGS. 3A to 3H are process cross-sectional views for describing a method of manufacturing the light emitting device package 100 according to an embodiment.

Figure 3A:
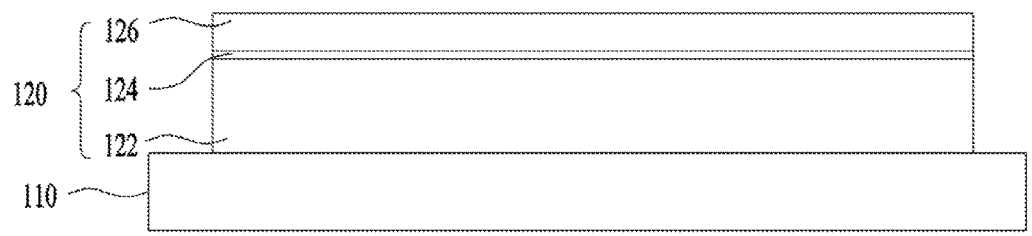
FIGS. 3A to 3H are process cross-sectional views for describing a method of manufacturing a light emitting device package according to an embodiment.

Referring to FIG. 3A, a light emitting structure 120 is formed on a substrate 110. That is, a first conductive type semiconductor layer 122, an active layer 124, and a second conductive type semiconductor layer 126 are sequentially stacked on the substrate 110 to form the light emitting structure 120.

First, the substrate 110 is provided. The substrate 110 may include a conductive material or non-conductive material. For example, the substrate 110 may include at least one of sapphire ($Al_2O_3$), GaN, SiC, ZnO, GaP, InP, $Ga_2O_3$, GaAs, or Si, but the embodiment is not limited to those materials for the substrate 110.

Then, the first conductive type semiconductor layer 122 is formed on the substrate 110. The first conductive type semiconductor layer 122 may be formed of a compound semiconductor, such as Group III-V, Group II-VI, or the like doped with a first conductive type dopant. When the first conductive type semiconductor layer 122 is an n-type semiconductor layer, the first conductive type dopant is an n-type dopant and may include Si, Ge, Sn, Se, or Te, but is not limited thereto.

For example, the first conductive type semiconductor layer 122 may include a semiconductor material having a composition formula of $Al_xIn_yGa_{(1-x-y)}N$ (0≤x≤1, 0≤y≤1, 0≤x+y≤1). The first conductive type semiconductor layer 122 may include at least one of GaN, InN, AlN, InGaN, AlGaN, InAlGaN, AlInN, AlGaAs, InGaAs, AlInGaAs, GaP, AlGaP, InGaP, AlInGaP, or InP.

Then, the active layer 124 is formed on the first conductive type semiconductor layer 122. The active layer 124 may be formed with at least one of a single well structure, a multiple well structure, a single quantum well structure, an MQW structure, a quantum-wire structure, or a quantum-dot structure.

A well layer/barrier layer of the active layer 124 may be formed with one or more pair structures among InGaN/GaN, InGaN/InGaN, GaN/AlGaN, InAlGaN/GaN, GaAs (InGaAs)/AlGaAs, and GaP(InGaP)/AlGaP, but is not limited thereto. The well layer may be formed of a material having a bandgap energy lower than a bandgap energy of the barrier layer.

A conductive type clad layer (not shown) may be formed on and/or under the active layer 124. The conductive type clad layer may be formed of a semiconductor having a bandgap energy higher than the bandgap energy of the barrier layer of the active layer 124. For example, the conductive type clad layer may include GaN, AlGaN, InAlGaN, a superlattice structure, etc. Further, the conductive type clad layer may be doped to be n-type or p-type.

Then, the second conductive type semiconductor layer 126 is formed on the active layer 124. The second conductive type semiconductor layer 126 may be formed of a semiconductor compound, and may be implemented as a compound semiconductor, such as group III-V or group II-VI compound semiconductor. For example, the second conductive type semiconductor layer 126 may include a semiconductor material having a composition formula of $In_xAl_yGa_{(1-x-y)}N$ (0≤x≤1, 0≤y≤1, 0≤x+y≤1). The second conductive type semiconductor layer 126 may be doped with a second conductive type dopant. When the second conductive type semiconductor layer 126 is a p-type semiconductor layer, the second conductive type dopant is a p-type dopant and may include Mg, Zn, Ca, Sr, Ba, etc.

Figure 3B:
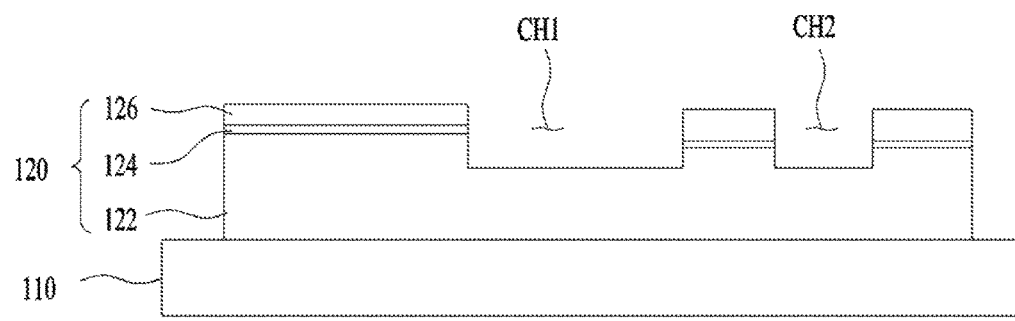

Then, referring to FIG. 3B, a part of the second conductive type semiconductor layer 126, a part of the active layer 124, and a part of the first conductive type semiconductor layer 122 are mesa-etched to form a first contact hole CH1 and a second contact hole CH2. Here, depths of each of the mesa-etched first and second contact holes CH1 and CH2 may be 800 nm, but the embodiment is not limited thereto.

Figure 3C:
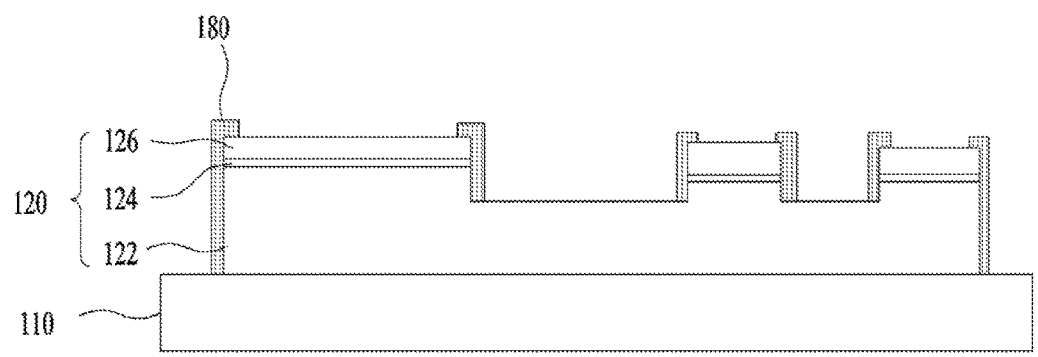

Then, referring to FIG. 3C, a passivation layer 180 is formed to surround sides and upper edges of the light emitting structure 120. The formation of the passivation layer 180 may be omitted. The passivation layer 180 may be formed of at least one of $SiO_2$, $TiO_2$, $ZrO_2$, $Si_3N_4$, $Al_2O_3$, or $MgF_2$, but the embodiment is not limited to those materials for the passivation layer 180.

Figure 3D:
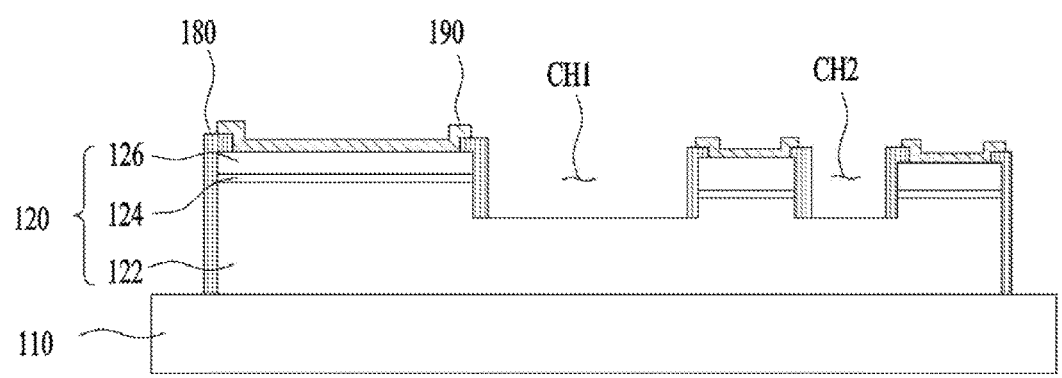

Then, referring to FIG. 3D, a light transmissible electrode layer 190 is formed on the second conductive type semiconductor layer 126 which is exposed and not covered by the passivation layer 180. The light transmissible electrode layer 190 may be TCO. For example, the light transmissible electrode layer 190 may be formed of at least one of ITO, IZO, IZTO, IAZO, IGZO, IGTO, AZO, ATO, GZO, IrOx, RuOx, RuOx/ITO, Ni/IrOx/Au, or Ni/IrOx/Au/ITO, but is not limited to the above materials. In some cases, the formation of the light transmissible electrode layer 190 may be omitted.

Figure 3E:
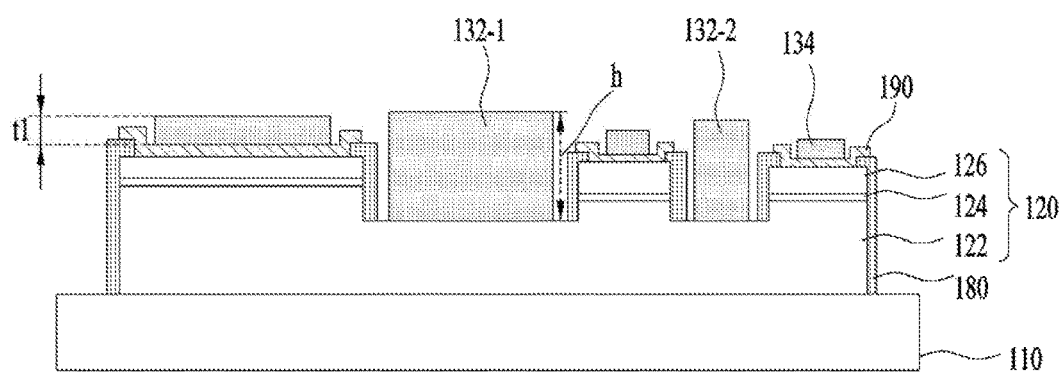

Then, referring to FIG. 3E, first electrodes 132-1 and 132-2 are formed on the first conductive type semiconductor layer 122 exposed at the first and second contact holes CH1 and CH2 formed by mesa-etching. Further, a second electrode 134 is formed on the light transmissible electrode layer 190. The first electrodes 132-1 and 132-2 may have a height h of 1 μm. Further, the second electrode 134 may have a first thickness t1 of 100 nm to 500 nm. However, the embodiment is not limited to the heights h of the first electrodes 132-1 and 132-2 and a specific value of the first thickness t1 of the second electrode 134.

Each of the first and second electrodes 132-1, 132-2, and 134 may be formed of a metal, and may be formed of Ag, Ni, Al, Rh, Pd, Ir, Ru, Mg, Zn, Pt, Au, Hf, or a selective combination thereof.

Figure 3F:
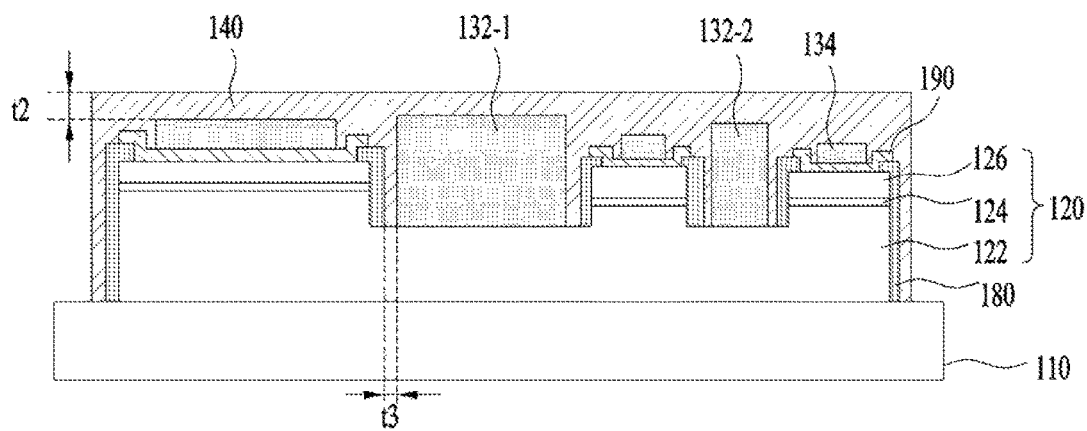

Then, referring to FIG. 3F, a first insulating layer 140 is formed to cover the light emitting structure 120, the passivation layer 180, the light transmissible electrode layer 190, the first electrodes 132-1 and 132-2, and the second electrode 134 which are disposed on the substrate 110. Here, the first insulating layer 140 may be a DBR. For example, the DBR may be formed by a PVD method. In this case, a third thickness t3 of the first insulating layer 140 formed between the first electrodes 132-1 and 132-2 and the sides of the light emitting structure 120 is formed smaller than a second thickness t2 of the first insulating layer 140 formed on the light emitting structure 120.

Generally, when a film is formed on a stepped layer, how close a ratio of a film thickness formed on a sidewall of the stepped layer to a film thickness formed on an upper portion of the stepped layer is to 1:1 refers to a step coverage characteristic. According to the embodiment, when the light emitting structure 120 on which the DBR is formed is stepped and the DBR is formed by a PVD method, a ratio at which the DBR is deposited on a sidewall of the light emitting structure 120 and a ratio at which the DBR is deposited on an upper portion of the light emitting structure 120 become different from each other. In consideration of this, a step coverage characteristic of the DBR may be poor. Accordingly, the reflectivity of the DBR formed on the sidewall of the light emitting structure 120 and the reflectivity of the DBR formed on the upper portion of the light emitting structure 120 may be different from each other.

Figure 3G:
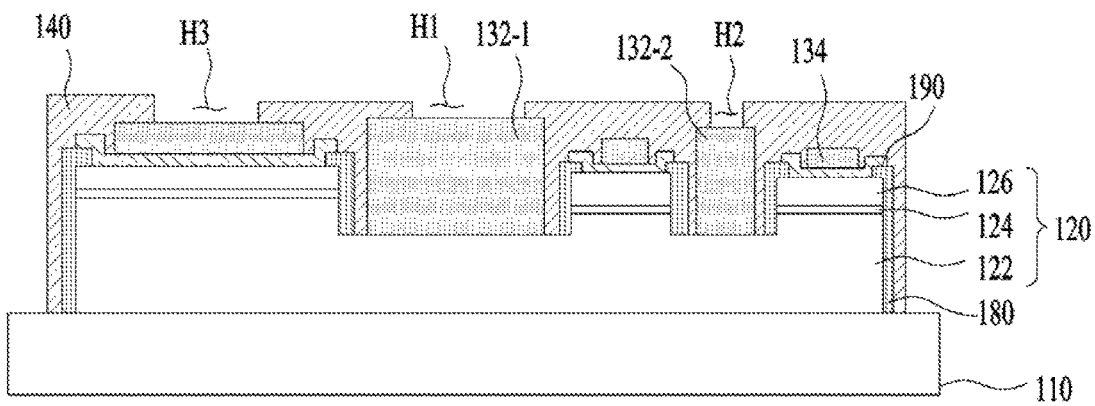

Then, referring to FIG. 3G, first and second holes H1 and H2 configured to expose the first electrodes 132-1 and 132-2 and a third hole H3 configured to expose the second electrode 134 are formed using a general photolithograph process.

Figure 3H:
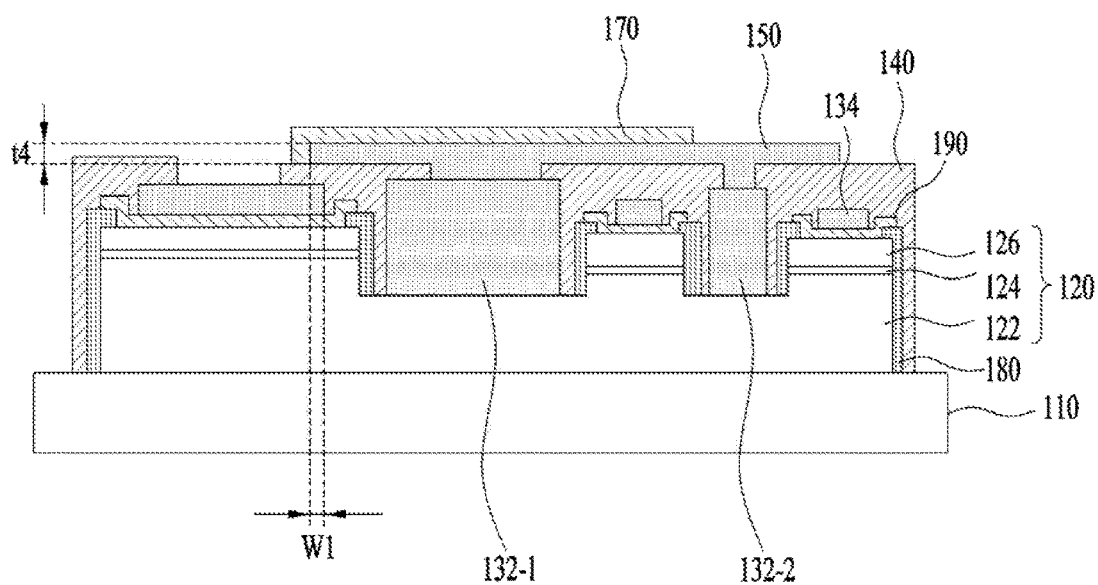

Then, referring to FIG. 3H, a reflective layer 150 is formed on the first insulating layer 140 to a fourth thickness t4 while burying the first and second holes H1 and H2. At this point, the reflective layer 150 is formed so that second electrode 134 may be overlapped with an end portion of the reflective layer 150 by a first width W1 in a vertical direction, e.g., a thickness direction of the light emitting structure 120. The reflective layer 150 may be formed of a reflective material such as silver (Ag).

Then, continuing to refer to FIG. 3H, a second insulating layer 170 is formed on an upper portion and one side of the reflective layer 150. The second insulating layer 170 may be formed of at least one of $SiO_2$, $TiO_2$, $ZrO_2$, $Si_3N_4$, $Al_2O_3$, or $MgF_2$, but the embodiment is not limited to those materials for the second insulating layer 170.

Then, referring to FIG. 2, a first pad 162 is formed on the second insulating layer 170 and the reflective layer 150, and a second pad 164 is formed on the second electrode 134 and the first and second insulating layers 140 and 170 while burying a third hole H3. At this point, the second pad 164 may be separated from the first pad 162 in a horizontal direction, and may be electrically separated from the reflective layer 150 by the second insulating layer 170. Each of the first and second pads 162 and 164 may be formed of a metal material having an electrical conductivity, and may include the same material as or a material different from that of each of the first and second electrodes 132-1, 132-2, and 134.

Then, first and second soldering portions 166 and 168 are respectively formed on the first and second pads 162 and 164.

As described above, during the forming from the substrate 110 to the first and second soldering portions 166 and 168, first and second lead frames 196A and 196B, an insulator 194 which electrically insulates the first and second lead frames 196A and 196B from each other, and a package body 192 are formed in a separate process.

Then, the first and second soldering portions 166 and 168 are respectively connected to the first and second lead frames 196A and 196B, a molding member 198 is filled into a cavity C of the package body 192, to complete the light emitting device package 100.

Hereinafter, a light emitting device package according to a comparative example and the light emitting device package according to the embodiment will be described with reference to the accompanying drawings. The light emitting device package according to the comparative example is a case in which the reflective layer 150 is omitted in the light emitting device package according to the embodiment.

Figure 4:
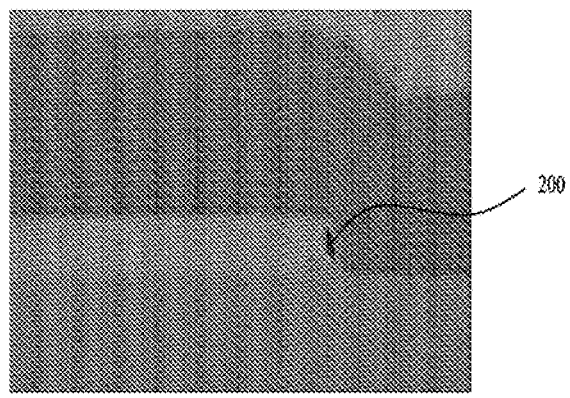
FIG. 4 is a perspective view illustrating a distributed Bragg reflector in a light emitting device package according to a comparative example.

FIG. 4 is a perspective view illustrating a DBR in a light emitting device package according to the comparative example.

Thicknesses of DBRs, i.e., the first insulating layer 140, formed on an upper portion and sides of the light emitting structure 120 are different from each other. In such a DBR having an inferior step coverage characteristic, cracks may occur or delamination may be generated by a void 200 shown in FIG. 4. Therefore, a reflective function may not be suitably performed at the first insulating layer 140 having a relatively small thickness. Particularly, light may be leaked through the second portion P2 having the third thickness t3 in the first insulating layer 140. That is, a great amount of light may be leaked through the first and second contact holes CH1 and CH2 where the second portion P2 is positioned.

To improve this, according to the embodiment, the reflective layer 150 is formed under the DBR having the poor step coverage characteristic, particularly under the first and second contact holes CH1 and CH2, to reflect light leaked to the outside, and thus the efficiency of light output can be improved.

A plurality of light emitting device packages according to the embodiment may be arrayed on a substrate, and optical members including a light guide plate, a prism sheet, a diffusion sheet, and the like may be disposed on a path of light of the light emitting device packages. The light emitting device packages, the substrate, and the optical members may serve as a backlight unit.

Further, the light emitting device package according to the embodiment may be applied to display devices, indicator devices, or lighting apparatuses.

Here, the display device may include a bottom cover, a reflective plate disposed on the bottom cover, a light emitting module which emits light, a light guide plate disposed in front of the reflective plate and configured to guide light emitted from the light emitting module in a forward direction, an optical sheet including prism sheets disposed in front of the light guide plate, a display panel disposed in front of the optical sheet, an image signal output circuit connected to the display panel and configured to supply an image signal to the display panel, and a color filter disposed in front of the display panel. Here the bottom cover, the reflective plate, the light emitting module, the light guide plate, and the optical sheet may form a backlight unit.

Further, the lighting apparatus may include a light source module including the substrate and the light emitting device package according to the embodiment, a heat dissipater which dissipates heat of the light source module, and a power supply which processes or converts an electrical signal provided from the outside to provide the processed or converted electrical signal to the light source module. For example, the lighting apparatus may include a lamp, a head lamp, or a street lamp.

The head lamp may include a light emitting module including light emitting device packages disposed on a substrate, a reflector which reflects light emitted from the light emitting module in a predetermined direction, e.g., in a forward direction, a lens which refracts light reflected from the reflector in a forward direction, and a shade which blocks or reflects a part of the light, which is reflected from the reflector and then directing to a lens, so that a light distribution pattern desired by a designer is formed.

In the light emitting device package according to the embodiment, a reflective layer is disposed under a DBR having an inferior step coverage characteristic, particularly under first and second contact holes, to reflect light to be leaked to the outside, and thus the light emitting device package can have an improved efficiency of light output. Further, in the light emitting device package according to the embodiment, by connecting a reflective layer to a first pad, an actual area of the first pad is increased, and the efficiency of heat dissipation can be improved.

Although embodiments have been described with reference to a number of illustrative embodiments thereof, it should be understood that numerous other modifications and embodiments can be devised that fall within the spirit and scope of the principles of this disclosure by those skilled in the art. More particularly, numerous variations and modifications are possible in the component parts and/or arrangements of the subject combination arrangement within the scope of the disclosure, the drawings, and the appended claims.

What is claimed is:

1. A light emitting device package comprising:
   a substrate;
   a light emitting structure disposed under the substrate and including a first conductive type semiconductor layer, an active layer, and a second conductive type semiconductor layer;
   a first electrode connected to the first conductive type semiconductor layer exposed through contact holes;
   a second electrode connected to the second conductive type semiconductor layer;
   a first insulating layer disposed to extend from under the light emitting structure to a space between a side of the light emitting structure and the first electrode and configured to reflect light, the first insulating layer including a first portion disposed under the light emitting structure;
   a reflective layer disposed under the first insulating layer and disposed under the entirety of the first electrode;
   a first pad and a second pad respectively connected to the first electrode and the second electrode;
   a second insulating layer disposed between the reflective layer and the second pad in a first direction in which the light emitting structure faces the substrate, the second insulating layer including a distributed Bragg reflector;
   a first soldering portion and a second soldering portion respectively connected to the first pad and the second pad and electrically separated from each other; and
   a first lead frame and a second lead frame respectively connected to the first soldering portion and the second soldering portion and electrically separated from each other,
   wherein the reflective layer overlaps the entirety of all of the contact holes in the first direction,
   wherein the first pad is connected to the reflective layer,
   wherein at least two of the first electrode, the reflective layer, or the first pad include the same material, and
   wherein the second insulating layer is overlapped with the second electrode and with the first portion of the first insulating layer in the first direction.

2. The light emitting device package of claim 1,
   wherein the first insulating layer further comprises:
   a second portion extending from the first portion and disposed between a side of the light emitting structure and the first electrode, and
   wherein the reflective layer is disposed to further extend to be under the second electrode.

3. The light emitting device package of claim 2, wherein the reflective layer comprises:
   a first part configured to be connected to the first electrode, the first part being overlapped with the second portion of the first insulating layer in the first direction;
   a second part extending from the first part in a second direction, the second part being overlapped in the first direction with a lower surface of the second conductive type semiconductor layer exposed without being covered by the second electrode and with the first portion of the first insulating layer, wherein the second direction is different from the first direction; and
   a third part extending from the second part in the second direction, the third part being overlapped in the first direction with the second electrode and with the first portion of the first insulating layer, wherein the third part corresponds to an end portion of the reflective layer.

4. The light emitting device package of claim 2, wherein the first insulating layer includes a distributed Bragg reflector.

5. The light emitting device package of claim 4, further comprising a passivation layer extending from a space between the second portion of the first insulating layer and the side of the light emitting structure to a lower part of the light emitting structure.

6. The light emitting device package of claim 2, wherein
   the first portion of the first insulating layer is disposed under the second electrode and has a first thickness in the first direction; and
   the second portion of the first insulating layer has a second thickness in the respective contact holes in the second direction; and
   wherein the first thickness is different from the second thickness.

7. The light emitting device package of claim 6, wherein the second thickness is smaller than the first thickness.

8. The light emitting device package of claim 1, wherein a thickness of the reflective layer is in a range of 100 nm to 500 nm.

9. The light emitting device package of claim 1, wherein a thickness of the second electrode is in a range of 100 nm to 1000 nm.

10. The light emitting device package of claim 3, wherein a minimum value of a width of the third part of the reflective layer overlapping the second electrode is 2 μm.

11. The light emitting device package of claim 3, wherein the third part of the reflective layer overlaps the light emitting structure in the first direction.

12. The light emitting device package of claim 1, further comprising a light transmissible electrode layer disposed between the second electrode and the second conductive type semiconductor layer.

13. The light emitting device package of claim 1, further comprising a package body which forms a cavity with the first and second lead frames, wherein the substrate, the light emitting structure, the first electrode, the second electrode, the first insulating layer and the reflective layer are disposed in the cavity.

14. A lighting apparatus including the light emitting device package of claim 1.

15. The light emitting device package of claim 1, wherein the second electrode includes Ag, and wherein the second insulating layer includes $SiO_2$.

* * * * *